United States Patent
Yamada (10) Patent No.: US 6,771,332 B2
(45) Date of Patent: Aug. 3, 2004

(54) LIQUID CRYSTAL DISPLAY DEVICE

(75) Inventor: Takahiro Yamada, Mobara (JP)

(73) Assignees: Hitachi, Ltd., Tokyo (JP); Hitachi Device Engineering Co., Ltd., Chiba-ken (JP)

(*) Notice: Subject to any disclaimer, the term of this patent is extended or adjusted under 35 U.S.C. 154(b) by 134 days.

(21) Appl. No.: 10/243,837

(22) Filed: Sep. 16, 2002

(65) Prior Publication Data

US 2003/0067577 A1 Apr. 10, 2003

(30) Foreign Application Priority Data

Oct. 9, 2001 (JP) ........................................ 2001-310863

(51) Int. Cl.[7] .............................................. G02F 1/1345
(52) U.S. Cl. ........................................ 349/62; 345/150
(58) Field of Search ................................ 349/149, 150, 349/151, 152, 65, 62

(56) References Cited

U.S. PATENT DOCUMENTS 6,111,629 A * 8/2000 Matsuhira et al. .......... 349/150
6,665,038 B2 * 12/2003 Endo ........................... 349/149
6,697,130 B2 * 2/2004 Weindorf et al. .............. 349/65

FOREIGN PATENT DOCUMENTS

JP          2001-133756        11/1999

* cited by examiner

*Primary Examiner*—Robert H. Kim
*Assistant Examiner*—David Y Chung
(74) *Attorney, Agent, or Firm*—Reed Smith LLP; Stanley P. Fisher, Esq.; Juan Carlos A. Marquez, Esq.

(57) ABSTRACT

A flexible substrate mounting the light sources thereon realizes a shape which can eliminate a largely projecting portion and a liquid crystal display device which uses such a flexible substrate is obtained. A strip-like portion is formed by providing an elongated cut in a flexible substrate and light sources are mounted on the strip-like portion. Due to such a constitution, the strip-like portion mounting the light sources 5 thereon has a shape which is substantially arranged parallel to the shape of the main portion 8 which occupies a most portion of the flexible substrate land hence, it is possible to eliminate a largely projecting portion. Then, the light sources 5 are arranged such that the strip-like portion is folded back at least once such that light from the light sources is incident on a light guide body 4.

6 Claims, 8 Drawing Sheets

LIQUID CRYSTAL DISPLAY DEVICE

BACKGROUND OF THE INVENTION

The present invention relates to a liquid crystal display device having an auxiliary light source device.

Figure 8:
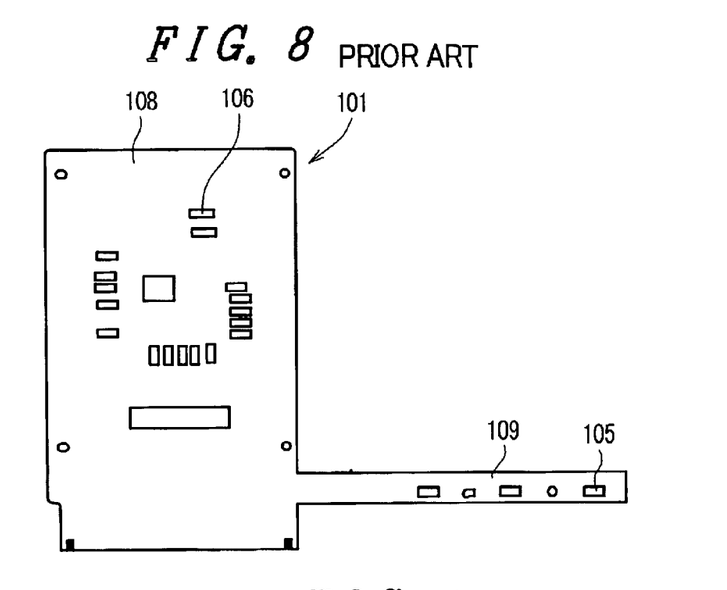
FIG. 8 is a plan view for explaining one example of a flexible substrate used in a conventional liquid crystal display device.

FIG. 8 is a plan view for explaining one example of a flexible substrate which is used in a conventional liquid crystal display device. Further, FIG. 9 is a perspective view for explaining one example of assembling steps of the conventional liquid crystal display device.

A flexible substrate 101 shown in FIG. 8 includes a first circuit component mounting part 108 and a second circuit component mounting part 109 which is formed in a strip shape in a direction orthgonally crossing the first circuit component mounting part 108, and forms a substantially L shape as a whole. A plurality of circuit components 106 are mounted on the first circuit component mounting part 108. On the other hand, three light sources 105 such as LEDs are mounted on the second circuit component mounting part 109 in parallel along the longitudinal direction of the strip. Here, the light sources 105 also constitute one kind of the circuit components 106. The circuit components 106 including the light sources 105 are mounted on one surface of the flexible substrate 101. That is, all parts are mounted on one surface side of the flexible substrate 101.

Figure 9:
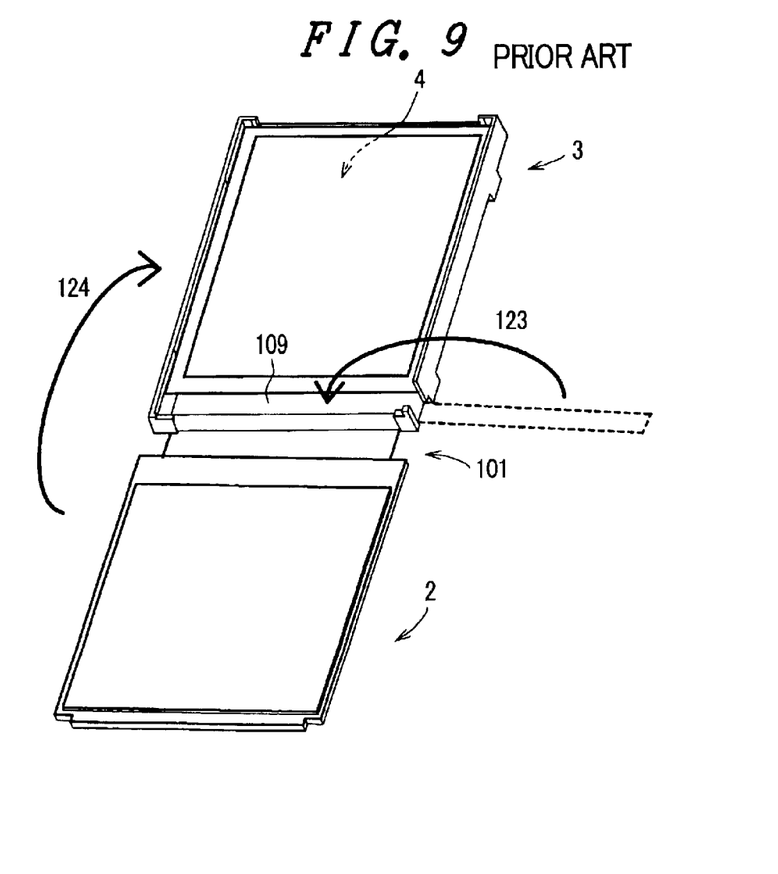
FIG. 9 is a perspective view for explaining one example of assembling steps of the conventional liquid crystal display device.

Then, as shown in FIG. 9, a liquid crystal display panel 2 and the flexible substrate 101 are connected and a light guide body unit 3 including a light guide body 4 is arranged above the flexible substrate 101. Here, the component mounting surface of the flexible substrate 101 is arranged at the light guide body unit 3 side. Then, the second circuit component mounting part 109 is folded back as indicated by an arrow 123 so as to make the light sources 105 face an incident light surface of the light guide body 4 in an opposed manner. Thereafter, the liquid crystal display panel 2 is folded back as indicated by an arrow 124 thus assembling a liquid crystal display device.

Besides the system explained in conjunction with FIG. 8 and FIG. 9, an example of the liquid crystal display device which mounts LEDs on a flexible substrate is described in Japanese Laid-open Patent Publication 133756/2001.

However, the conventional flexible substrate 101 shown in FIG. 8 is configured such that the strip-like second circuit component mounting part 109 is largely projected from other portion and hence, there has been a problem that the handling of the flexible substrate 101 is difficult during the component transportation. Particularly, there exists a restriction with respect to a profile of the flexible substrate which can be transported by an automatic assembling device. That is, when the flexible substrate includes a largely projecting portion, the automatic assembling device is clogged with the flexible substrate. Accordingly, it is necessary to restrict the size of the flexible substrate 101 within a given size. However, this imposes the restriction on the size of the first circuit component mounting part 108 and hence, the degree of freedom in designing is restricted. Further, in manufacturing the flexible substrate, due to the presence of this largely projecting portion, a waste portion is formed on a preform thus pushing up the manufacturing cost.

Accordingly, it is an object of the present invention to realize a shape of a flexible substrate having light sources mounted thereon which is free from a largely projecting portion and to provide a liquid crystal display device which uses such a flexible substrate.

SUMMARY OF THE INVENTION

To achieve the above-mentioned object, in the present invention, a strip-like portion is formed by imparting an elongated cut in a flexible substrate and light sources are mounted on the strip-like portion. Due to such a constitution, the strip-like portion on which the light sources are mounted assumes a shape generally followers the shape of a major portion which substantially occupies a most portion of the flexible substrate and hence, the flexible substrate is free from a portion which is largely projected from the flexible substrate. Then, the light sources are arranged such that light from the light sources is incident on a light guide body by folding back the strip-like portion at least once.

As representative structures of the liquid crystal display device to which the present invention is applied, followings are considered.

(1) In a liquid crystal display device comprising a liquid crystal display panel, a flexible substrate on which circuit components including a plurality of light sources are mounted, and a light guide body, wherein
  the flexible substrate includes a first circuit component mounting part and a second circuit component mounting part which are separated by an elongated cut,
  the second circuit component mounting part is formed in a strip shape having a width narrower than a width of the first circuit component mounting part, and the plurality of light sources are mounted on the second circuit component mounting part, and
  the plurality of light sources are arranged such that the second circuit component mounting part is folded back at least once to make light from the plurality of light sources incident on the light guide body.

(2) In the constitution (1), a longitudinal direction of the second circuit component mounting part before folding-back thereof is arranged substantially perpendicular to a longitudinal direction of the second circuit component mounting part after folding-back thereof.

(3) In the constitution (1) or (2), the elongated cut is formed along a longitudinal direction of the flexible substrate.

(4) In anyone of the constitutions (1) to (3), the light guide body is arranged between the liquid crystal display panel and the first circuit component mounting part.

(5) In the constitutions (4), a circuit component mounting surface of the first circuit component mounting part is arranged at a light guide body side.

(6) In any one of the constitutions (1) to (5), the circuit components including the plurality of light sources are mounted on one-side surface of the flexible substrate.

The present invention is not limited to the above-mentioned constitutions and various modifications are conceivable without departing from the technical concept of the present invention.

DESCRIPTION OF THE PREFERRED EMBODIMENTS

Figure 1:
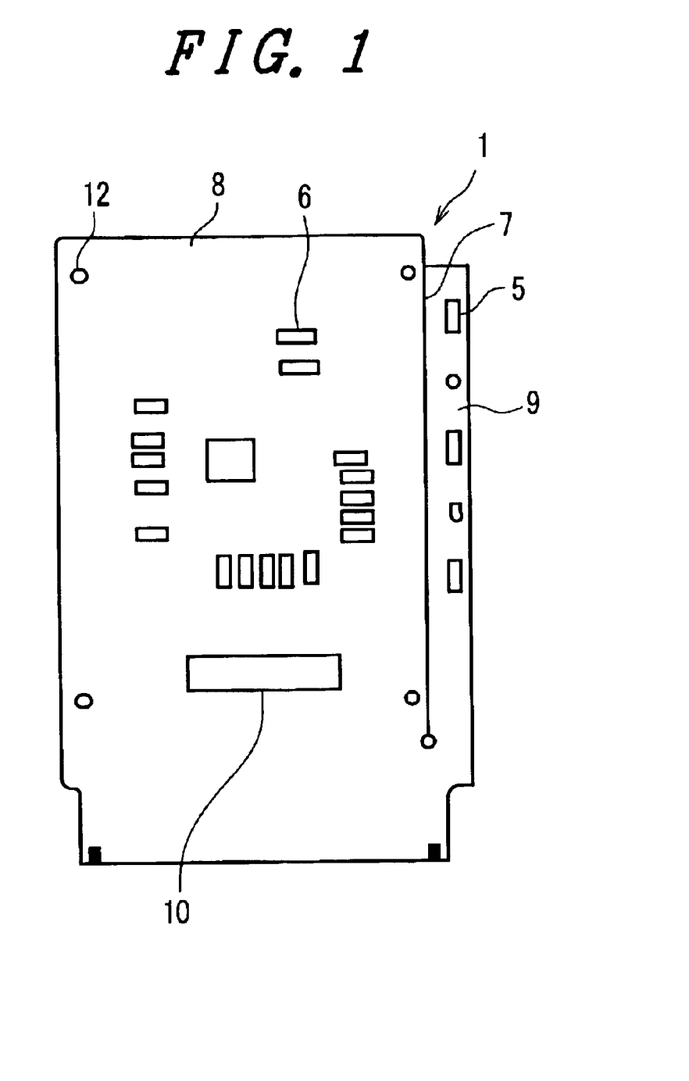
FIG. 1 is a plan view for explaining one example of a flexible substrate used in a liquid crystal display device to which the present invention is applied.

FIG. 1 is a plan view for explaining one example of a flexible substrate used in a liquid crystal display device to which the present invention is applied.

As shown in FIG. 1, in a flexible substrate 1 in a developed state before assembling, an elongated cut 7 is formed along the longitudinal direction of the flexible substrate 1. This elongated cut 7, separates a first circuit component mounting part 8 from a second circuit component mounting part 9. A plurality of circuit components 6 are mounted on the first circuit component mounting part 8. As examples of the circuit components 6, drivers such as a gate driver 10, a power source, capacitors and the like are named. However, it is not always necessary to mount all of them on the flexible substrate 1. For example, they may be mounted on other place such as a substrate of the liquid crystal display panel, for example. The first circuit component mounting part 8 constitutes a major part which occupies a most portion of the flexible substrate 1. Here, numeral 12 indicates positioning holes. Further, although an interface is mounted on the flexible substrate 1 besides the above-mentioned components, the illustration of the interface is omitted from the drawing.

The second circuit component mounting part 9 is formed in a strip-like shape having a width narrower than that of the first circuit component mounting part 8. Here, three light sources 5 such as LEDs, for example, are mounted in parallel on the second circuit component mounting part 9. Here, the number of light sources 5 is not limited to three. That is, the necessary number (equal to or more than one) of light sources may be mounted on the second circuit component mounting part 9. When a plurality of the light sources 5 are arranged in parallel, it is possible to have an advantageous effect that a plurality of the light sources 5 can be collectively arranged when the light sources 5 are made to face a light incident surface of a light guide body 4 in an opposed manner in the assembling step which will be explained later. Here, the light sources 5 also constitute one kind of the circuit components 6.

In this manner, by mounting the light sources 5 on the second circuit component mounting part 9 having a strip shape which is formed by producing the elongated cut 7, the strip-like portion assumes a shape which is arranged substantially along a shape of the first component mounting part 8 which constitutes the major portion occupying a most portion of the flexible substrate 1. Accordingly, different from the conventional flexible substrate 101 shown in FIG. 8, the flexible substrate 1 can eliminate a largely projecting portion. Here, the expression "a shape which is arranged substantially along" includes not only a case in which both of the first and second component mounting parts 8, 9 are arranged in parallel in a strict meaning but also a case in which these component mounting parts 8, 9 are arranged with an opened angle therebetween.

Further, even when the light sources 5 are mounted in a plural number so that the strip-like portion is elongated, this elongated portion is not projected.

Here, in FIG. 1, the cut 7 is formed in the longitudinal direction of the flexible substrate 1. Due to such a constitution, it is possible to obtain an advantageous effect that even when the strip-like portion is elongated, the strip-like portion can be accommodated within a longitudinal range of the flexible substrate 1. However, the formation of the cut 7 is not limited to such a constitution and the cut 7 may be formed in directions other than the longitudinal direction.

Further, with respect to the shape of the cut 7, in FIG. 1, the cut 7 is formed as a single line and a hole is formed at a distal end portion thereof (proximal end portion of the strip-like portion). However, the cut 7 is not limited to such a shape and may be formed in a rectangular shape or in a U shape. In this case, a gap between the first circuit component mounting part 8 and the second circuit component mounting part 9 may be slightly expanded. Further, the cut 7 may be formed in a V shape. In this case, a region of the first circuit component mounting part 8 is cut out in the oblique direction and the second circuit component mounting part 9 is extended while making a slightly opened angle with respect to the first circuit component mounting part 8. Although the second circuit component mounting part 9 is eventually slightly projected from the first circuit component mounting part 8, there exists no large projection of the second circuit component mounting part 9 compared to the case in which the second circuit component mounting part 109 is extended with an opened angle of 90 degrees with respect to the first circuit component mounting part 108 in an L shape as shown in FIG. 8. The angle of projection may preferably be set to an angle such that the second circuit component mounting part 109 is extended with the opened angle of equal to or less than 45 degrees. It is more preferable to set such an angle to equal to or less than 30 degrees and it is further preferable to set such an angle to equal to or less than 15 degrees. That is, it is desirable that the opened angle approaches 0 degree as close as possible. The shape of the cut 7 is not limited to the illustrated shape and various other shapes can be adopted.

The circuit components 6 including the light sources 5 are mounted on one surface of the flexible substrate 1. Accordingly, compared to a case in which the circuit components 6 are mounted on both sides of the flexible substrate 1, the manufacturing cost can be reduced and the manufacturing step can be simplified.

Now, assembling steps of the liquid crystal display device using this flexible substrate 1 are explained.

FIG. 2 to FIG. 5 are perspective views for explaining the assembling steps of the liquid crystal display device according to the present invention. In these drawings, the illustration of the circuit components 6 and the like are omitted. With respect to parts identical with those parts shown in FIG. 1, the same numerals are allocated and the repeated explanation is omitted. The same goes for other drawings which are referred to hereinafter.

Figure 2:
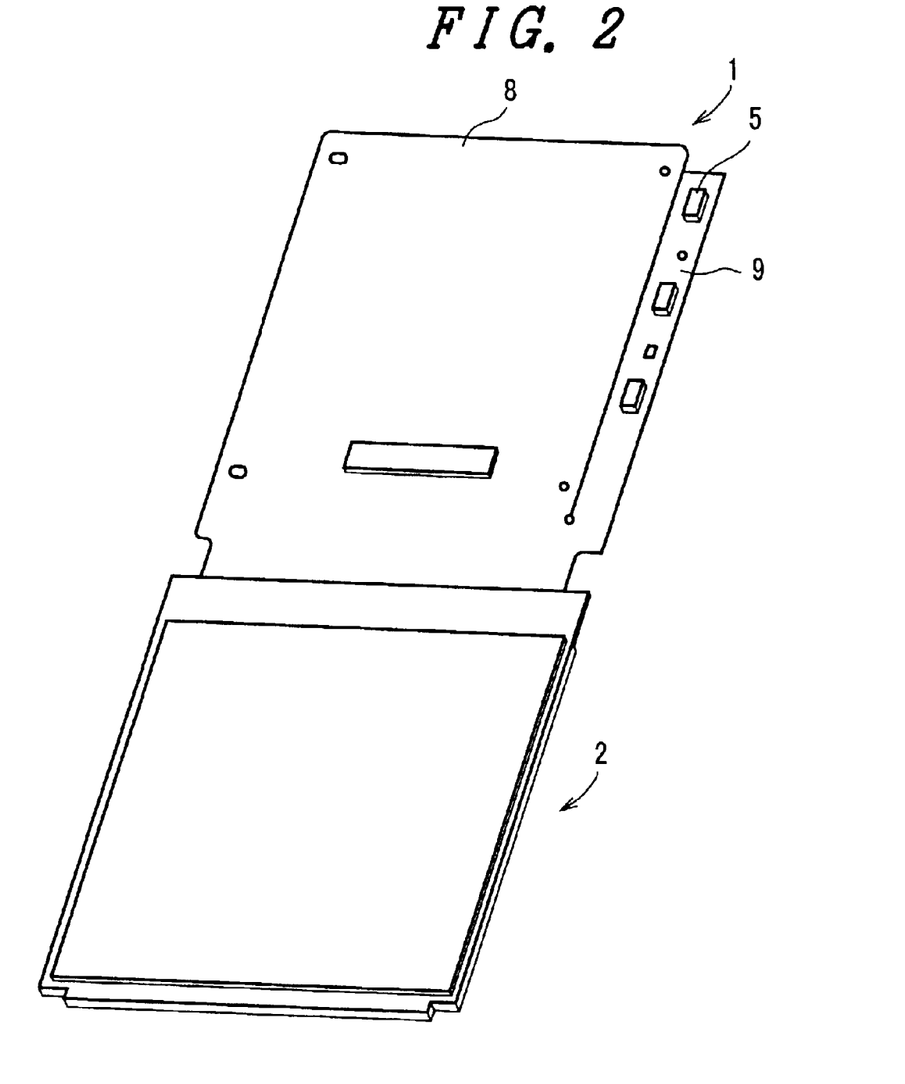
FIG. 2 is a perspective view for explaining an assembling step of a liquid crystal display device according to the present invention.

As shown in FIG. 2, the flexible substrate 1 which is explained in conjunction with FIG. 1 and the liquid crystal display panel 2 are connected to each other. Here, the circuit component mounting surface of the flexible substrate 1 is illustrated as a front surface side.

Figure 3:
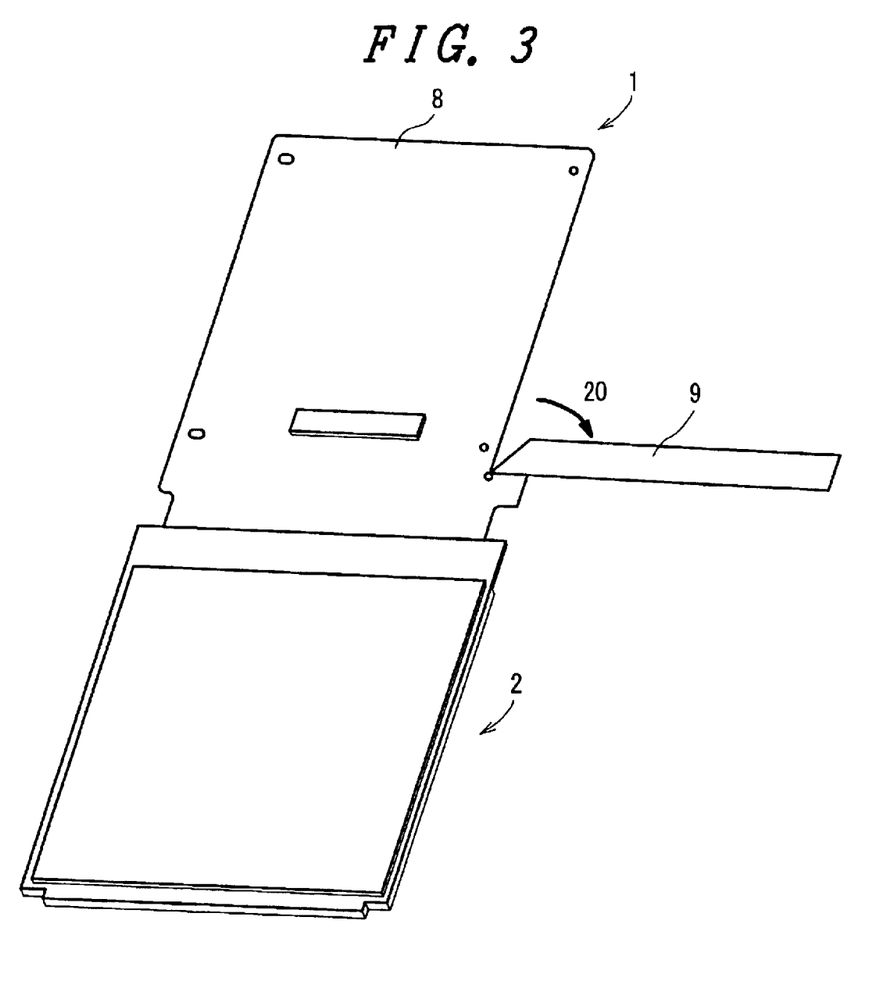
FIG. 3 is a perspective view for explaining an assembling step of a liquid crystal display device according to the present invention.

Subsequently, as shown in FIG. 3, the strip-like second circuit component mounting part 9 on which the light sources 5 are mounted is folded back in the direction indicated by an arrow 20 which is different from the previous direction by 90 degrees such that the strip-like circuit component mounting part 9 turns inside out.

Figure 4:
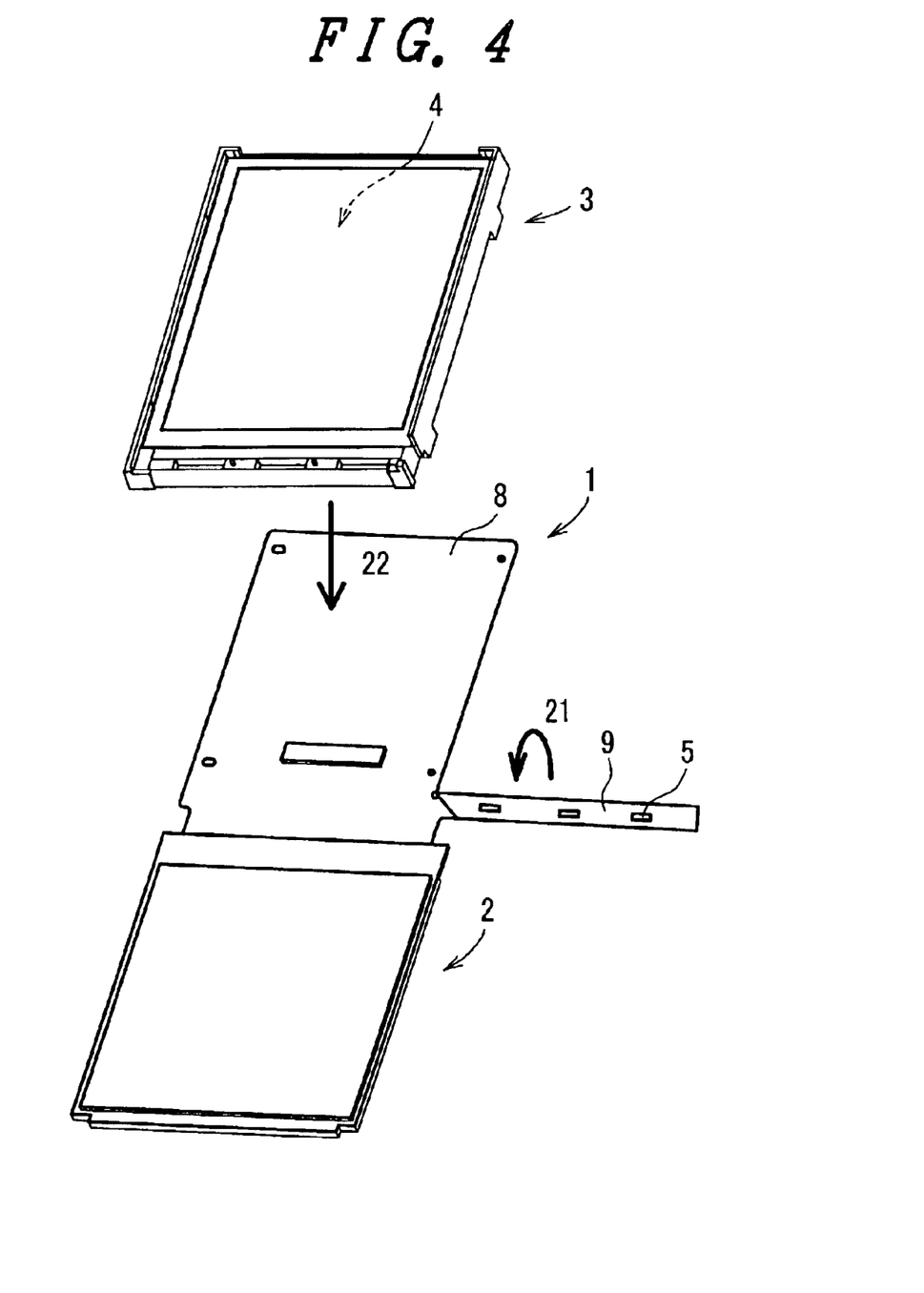
FIG. 4 is a perspective view for explaining an assembling step of a liquid crystal display device according to the present invention.

Further, as shown in FIG. 4, the second circuit component mounting part 9 is further folded back as indicated by an arrow 21 in the downward direction in the drawing such that the component mounting surface forms a front face side. Due to such an operation, the flexible substrate 1 can have the substantially same constitution as that of the conventional flexible substrate 101 shown in FIG. 8. Further, a light guide body unit 3 having the light guide body 4 is arranged on the first circuit component mounting part 8 as indicated by an arrow 22.

Figure 5:
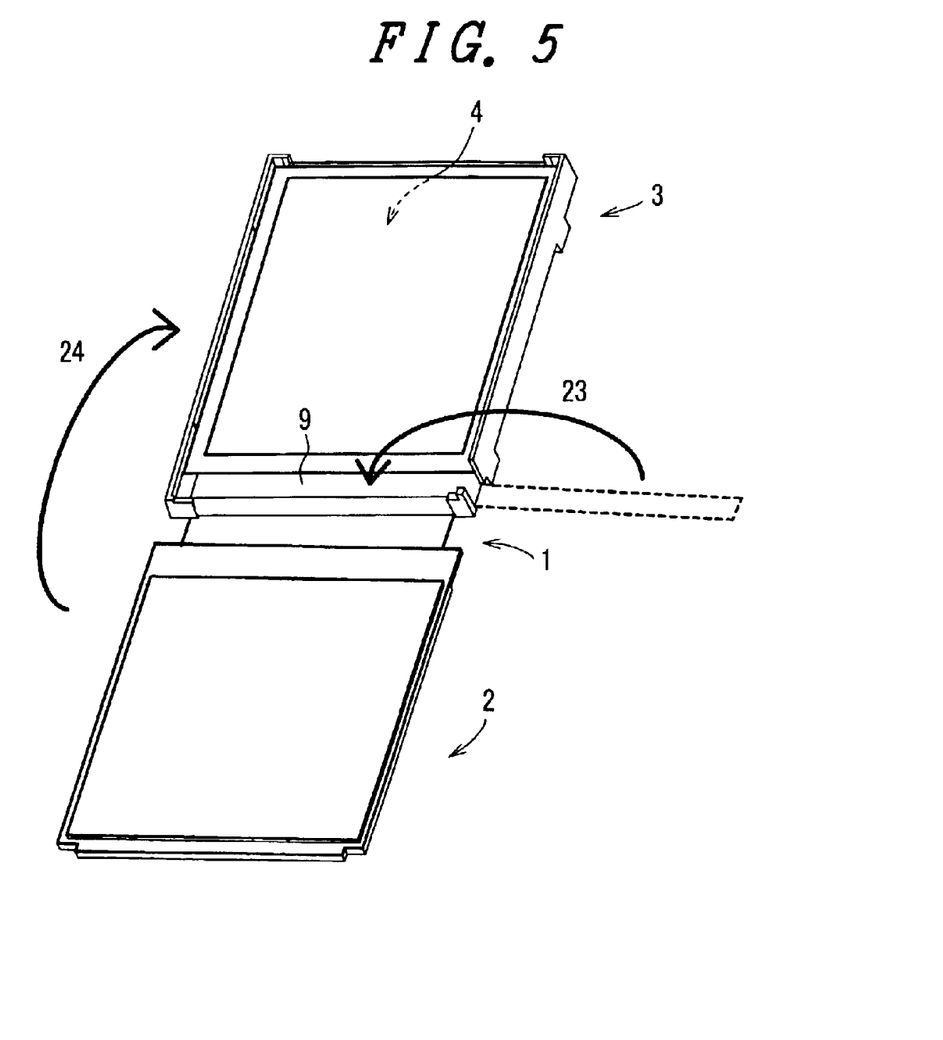
FIG. 5 is a perspective view for explaining an assembling step of a liquid crystal display device according to the present invention.

Subsequently, as shown in FIG. 5, the second circuit component mounting part 9 is folded back in the direction as indicated by an arrow 23 toward a light incident surface of the light guide body 4 so the light sources 5 can be located such that light from the light sources 5 is incident on the light guide body 4. Then, the liquid crystal display panel is folded back as indicated by an arrow 24 so that the assembling of the liquid crystal display device is completed in a state that the light guide body 4 is sandwiched between the flexible substrate 1 and the liquid crystal display panel 2.

In this embodiment, since the extending direction of the second circuit component mounting part 9 in the developed state before assembling is different from the direction of the light incident surface of the light guide body 4, the extending direction of the second circuit component mounting part 9 after assembling is different from the extending direction of the second circuit component mounting part 9 before assembling. Although an angle between them makes 90 degrees in this embodiment, it is unnecessary to set such an angle to a right angle in a strict sense and the angle maybe set to an approximately right angle. The range of deviation is preferably within ±15 degrees. It is not always necessary to set the extending direction of the second circuit component mounting part 9 in the developed state before assembling different from the light incident surface direction of the light guide body 4.

Figure 6:
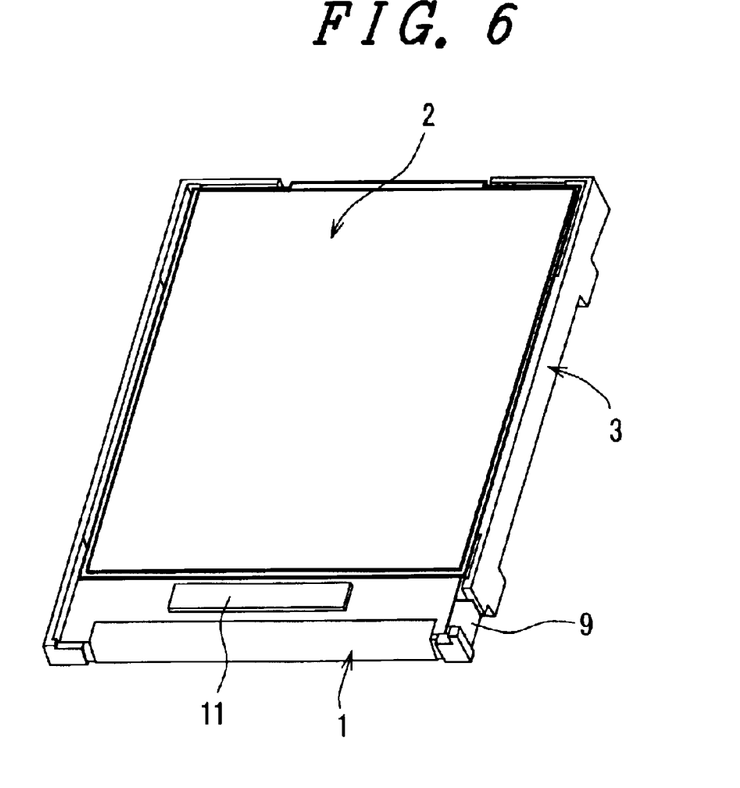
FIG. 6 is a perspective view of a liquid crystal display device after assembling according to the present invention.

FIG. 6 is a perspective view of a liquid crystal display device according to the present invention after assembling.

Although a drain driver 11 is mounted on a substrate of the liquid crystal display panel 2 in this embodiment, the arrangement of the drain driver 11 may be suitably changed such that the drain driver 11 may be integrally formed with a gate driver as one chip or may be mounted on the flexible substrate 1.

Figure 7:
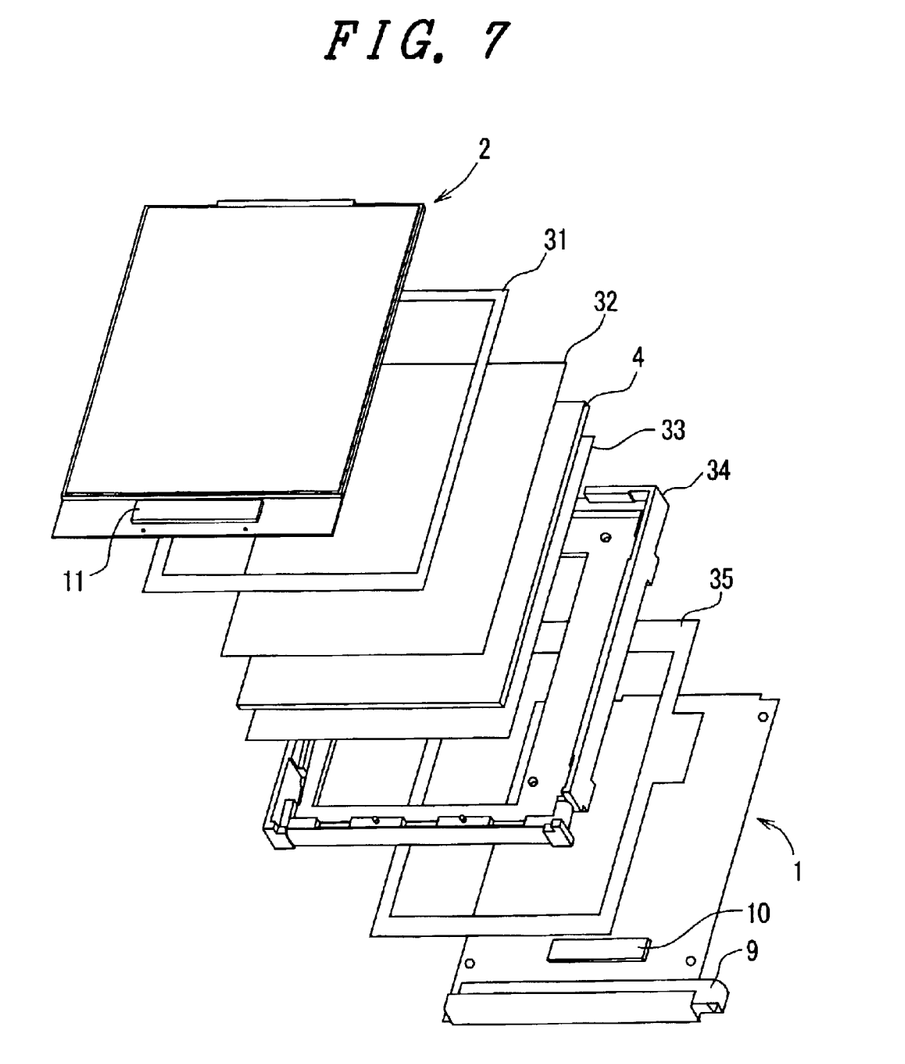
FIG. 7 is a developed perspective view for explaining the constitution of the liquid crystal display device shown in FIG. 6.

FIG. 7 is a developed perspective view for explaining the constitution of the liquid crystal display device shown in FIG. 6.

Between the liquid crystal display panel 2 and the flexible substrate 1, the light guide body unit 3 having the light guide body 4 is arranged. The light guide body unit 3 is formed by sequentially laminating a double-sided adhesive tape 31, an optical sheet 32, the light guide body 4, a reflection sheet 33, a mold 34 which accommodates these components, and a double-sided adhesive tape 35 in this order. However, this constitution is merely an example and various modifications can be considered.

In the embodiment which has been explained heretofore, the folding is performed three times. However, the series of folding operations may be replaced by the one folding operation by folding back the second circuit component mounting part 9 to the light incident surface side of the light guide body 4 in the first folding operation. In this case, however, since the proximal end portion of the second circuit component mounting part 9 is projected to some extent compared to the case which has been explained in conjunction with FIG. 2 to FIG. 5, a margin becomes necessary with respect to the flexible substrate 1.

Further, although the component mounting surface of the flexible substrate 1 is arranged at the light guide body 4 side, the component mounting surface may be arranged on a side opposite to the light guide body 4 side. In this case, it is also possible to make the light from the light sources 5 incident on the light guide body 4 by folding back the second circuit component mounting part 9 once or more.

Further, the mounting of the circuit components 6 is not limited to one surface of the flexible substrate 1. That is, the circuit components 6 can be mounted on both surfaces of the flexible substrate 1, for example.

Further, the auxiliary light source device may be a front light system in place of the backlight system. In this case, the light guide body 4 is not arranged at the back surface side of the liquid crystal display panel 2 but is arranged at the display screen side of the liquid crystal display panel 2.

According to the present invention, it is possible to make a flexible substrate on which light sources are mounted thereon in the shape which can eliminate the largely projecting portion and a liquid crystal display device which uses such a flexible substrate.

What is claimed is:

1. A liquid crystal display device comprising a liquid crystal display panel, a flexible substrate on which circuit components including a plurality of light sources are mounted, and a light guide body, wherein
    the flexible substrate includes a first circuit component mounting part and a second circuit component mounting part which are separated by an elongated cut,
    the second circuit component mounting part is formed in a strip shape having a width narrower than a width of the first circuit component mounting part, and the plurality of light sources are mounted on the second circuit component mounting part, and
    the plurality of light sources are arranged such that the second circuit component mounting part is folded back at least once to make light from the plurality of light sources incident on the light guide body.

2. A liquid crystal display device according to claim 1, wherein a longitudinal direction of the second circuit component mounting part before folding-back thereof is arranged substantially perpendicular to a longitudinal direction of the second circuit component mounting part after folding-back thereof.

3. A liquid crystal display device according to claim 1, wherein the elongated cut is formed along a longitudinal direction of the flexible substrate.

4. A liquid crystal display device according to claim 1, wherein the light guide body is arranged between the liquid crystal display panel and the first circuit component mounting part.

5. A liquid crystal display device according to claim 4, wherein a circuit component mounting surface of the first circuit component mounting part is arranged at a light guide body side.

6. A liquid crystal display device according to claim 1, wherein the circuit components including the plurality of light sources are mounted on one-side surface of the flexible substrate.

* * * * *